US011443675B2

(12) United States Patent
Chang et al.

(10) Patent No.: US 11,443,675 B2
(45) Date of Patent: Sep. 13, 2022

(54) SHIFT REGISTER CIRCUIT AND PIXEL DRIVING DEVICE

(71) Applicant: AU Optronics Corporation, Hsin-Chu (TW)

(72) Inventors: Che-Chia Chang, Hsin-Chu (TW); Yi-Jung Chen, Hsin-Chu (TW); Shang-Jie Wu, Hsin-Chu (TW); Yu-Chieh Kuo, Hsin-Chu (TW); Hsien-Chun Wang, Hsin-Chu (TW); Ming-Hung Chuang, Hsin-Chu (TW); Mei-Yi Li, Hsin-Chu (TW); Sin-An Lin, Hsin-Chu (TW); Chen-Ying Chou, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/468,720

(22) Filed: Sep. 8, 2021

(65) Prior Publication Data

US 2022/0223085 A1 Jul. 14, 2022

(30) Foreign Application Priority Data

Jan. 12, 2021 (TW) .................................. 110101125

(51) Int. Cl.
*G09G 3/36* (2006.01)
*G09G 3/20* (2006.01)
*G11C 19/28* (2006.01)

(52) U.S. Cl.
CPC ................ *G09G 3/20* (2013.01); *G11C 19/28* (2013.01); *G09G 2300/0809* (2013.01); *G09G 2310/0286* (2013.01); *G09G 2310/08* (2013.01)

(58) Field of Classification Search
CPC ......... G09G 2310/0286; G09G 3/3266; G09G 3/3674; G09G 2310/0289; G09G 2320/0247; G09G 2320/0257; G09G 2300/0871; G09G 2320/0214; G09G 2320/0209; G09G 2320/045;
(Continued)

(56) References Cited

U.S. PATENT DOCUMENTS 10,847,237 B2 * 11/2020 Xiang .................. G11C 19/287
2016/0064098 A1 3/2016 Han et al.
(Continued)

FOREIGN PATENT DOCUMENTS

CN 103700357 B 1/2016

*Primary Examiner* — Duc Q Dinh
(74) *Attorney, Agent, or Firm* — WPAT, PC

(57) ABSTRACT

A shift register circuit includes a driving signal generating circuit, a coupling circuit, and a sweep signal generating circuit. The driving signal generating circuit is configured to receive a plurality of first clock signals, a low voltage source, an initial signal, and a first high voltage source so as to output a driving signal. The coupling circuit is coupled to the driving signal generating circuit. The coupling circuit is configured to transmit the low voltage source. The sweep signal generating circuit is coupled to the coupling circuit. The sweep signal generating circuit is configured to receive a second clock signal, the low voltage source, and a second high voltage source so as to output a sweep signal. A waveform of the sweep signal includes an oblique waveform. The first high voltage source and the second high voltage source are electrically independent of each other.

10 Claims, 6 Drawing Sheets

(58) Field of Classification Search
CPC .......... G09G 2310/027; G09G 3/3275; G09G 3/3685; G09G 2310/0267; G09G 2310/0278; G09G 2310/06; G09G 3/32; G09G 3/2014; G09G 3/3258; G09G 3/30; G09G 3/3241; G09G 2310/0272; G09G 2310/0283; G09G 2300/0809; G09G 2310/08; G11C 19/287; G06F 3/04166; G06F 1/26; H04N 5/357
See application file for complete search history.

(56) References Cited

U.S. PATENT DOCUMENTS

| | | | |
|---|---|---|---|
| 2018/0182341 A1* | 6/2018 | Imajo | G09G 3/20 |
| 2019/0130857 A1* | 5/2019 | Ma | G09G 3/3677 |
| 2019/0325845 A1* | 10/2019 | Zhu | G09G 3/2074 |

\* cited by examiner

SHIFT REGISTER CIRCUIT AND PIXEL DRIVING DEVICE

CROSS-REFERENCE TO RELATED APPLICATION

This application claims priority to Taiwan Application Serial Number 110101125, filed on Jan. 12, 2021, which is herein incorporated by reference in its entirety.

BACKGROUND

Field of Invention

The present disclosure relates to an electronic device. More particularly, the present disclosure relates to a shift register circuit and a pixel driving device.

Description of Related Art

In a conventional panel, shift registers are arranged in a space of a circuit layout between a pixel and a pixel with that a size of a display panel increases. Based on this design of circuit layout, traces of shift registers and data lines are cross over to each other. Therefore, driving signals from shift registers often couple to data lines so as to generate mura effect in a panel.

In addition, due to a conventional design of a voltage regulator circuit in a panel, a waveform of a sweep signal has serious ripples and a slope of a sweep signal has a drop risk.

For the foregoing reason, there is a need to provide other suitable designs for driving pixels and circuits to solve the problems of the prior art.

SUMMARY

One aspect of the present disclosure provides a shift register circuit. The shift register circuit includes a driving signal generating circuit, a coupling circuit, and a sweep signal generating circuit. The driving signal generating circuit is configured to receive a plurality of first clock signals, a low voltage source, an initial signal, and a first high voltage source so as to output a driving signal according to the plurality of first clock signals, the low voltage source, the initial signal, and the first high voltage source. The coupling circuit is coupled to the driving signal generating circuit. The coupling circuit is configured to transmit the low voltage source. The sweep signal generating circuit is coupled to the coupling circuit. The sweep signal generating circuit is configured to receive a second clock signal, the low voltage source, and a second high voltage source. The sweep signal generating circuit output a sweep signal according to the second clock signal, the low voltage source, and the second high voltage source. A waveform of the sweep signal includes an oblique waveform. The first high voltage source and the second high voltage source are electrically independent of each other.

Another aspect of the present disclosure provides a pixel driving device. The pixel driving device includes at least one data line and at least one shift register circuit. The at least one data line includes a first side and a second side. The first side is opposite to the second side. The at least one shift register circuit includes a driving signal generating circuit, a coupling circuit, and a sweep signal generating circuit. The driving signal generating circuit is configured to receive a plurality of first clock signals, a low voltage source, an initial signal and a first high voltage source so as to output a driving signal according to the plurality of first clock signals, the low voltage source, the initial signal, and the first high voltage source. The coupling circuit is coupled to the driving signal generating circuit. The coupling circuit is configured to transmit the low voltage source. The sweep signal generating circuit is coupled to the coupling circuit. The sweep signal generating circuit is configured to receive a second clock signal, the low voltage source, and a second high voltage source. The sweep signal generating circuit output a sweep signal according to the second clock signal, the low voltage source, and the second high voltage source. A waveform of the sweep signal includes an oblique waveform. The first high voltage source and the second high voltage source are electrically independent of each other. The driving signal generating circuit is located at the first side of the at least one data line. The sweep signal generating circuit is located at the second side of the at least one data line.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
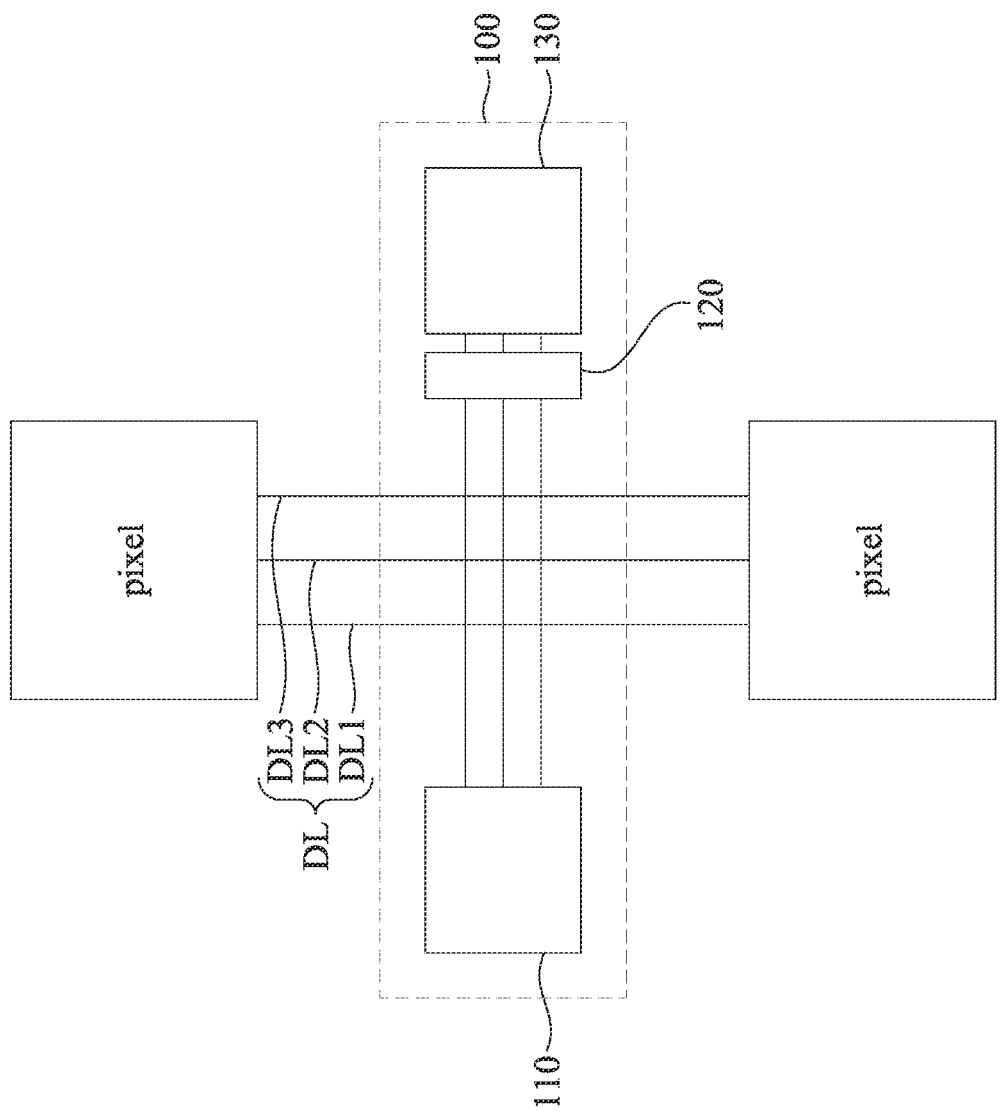
FIG. 1 depicts a schematic diagram of a pixel driving device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

FIG. 1 depicts a schematic diagram of a pixel driving device 1000 according to some embodiments of the present disclosure. In some embodiments, as shown in FIG. 1, the pixel driving device 1000 includes at least one data line DL (e.g. data line DL1, data line DL2, and data line DL3) and at least one shift register circuit 100. The at least one data line DL includes a first side (e.g. a left side of the figure) and a second side (e.g. a right side of the figure). The first side is opposite to the second side. It is noted that although the first side and the second side are depicted as a left side and a right side in FIG. 1 respectively. In practice, the first side and the second side are not limited to the left side and the right side.

The shift register circuit 100 mentioned in the present disclosure is applied to Micro Light Emitting Diode Displays, especially applied to pixel driving circuits having a function of pulse width modulating (PWM). The shift register circuit 100 needs to sequentially output sweep signals so as to drive pixel driving circuits in each column for compensation and luminescence of Micro Light Emitting Diode Displays. Therefore, sweep signals mentioned in the present disclosure are based on pixel driving circuits having a function of pulse width modulating (PWM).

In some embodiments, the shift register circuit 100 includes a driving signal generating circuit 110, a coupling circuit 120, and a sweep signal generating circuit 130. The coupling circuit 120 is coupled to the driving signal generating circuit 110. The sweep signal generating circuit 130 is coupled to the coupling circuit 120. In some embodiments, the driving signal generating circuit 110 is located at the first side of the at least one data line DL. The sweep signal generating circuit 130 is located at the second side of the at least one data line DL. In some embodiments, the coupling circuit 120 and the sweep signal generating circuit 130 are disposed at the second side of the at least one data line DL.

Figure 2:
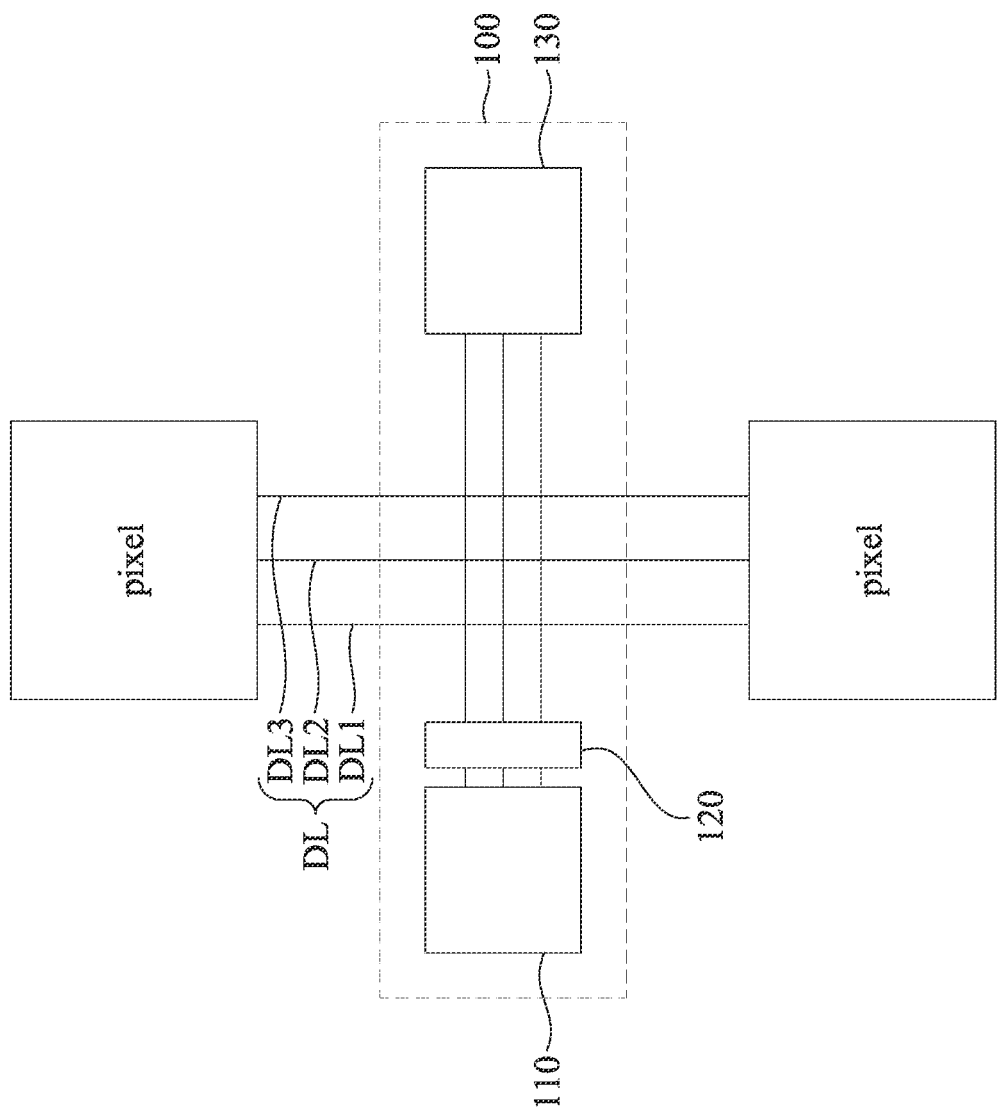
FIG. 2 depicts a schematic diagram of a pixel driving device according to some embodiments of the present disclosure.

FIG. 2 depicts a schematic diagram of a pixel driving device 1000 according to some embodiments of the present disclosure. In some embodiments, as shown in FIG. 2, compared with FIG. 1, the pixel driving device 1000 only changes a location of the coupling circuit 120. The coupling circuit 120 and the driving signal generating circuit 110 are disposed at the first side of the at least one data line DL. It is noted that a structure and a location of the coupling circuit 120 can be designed according to actual needs, and not limited to embodiments shown in FIG. 2.

Figure 3:
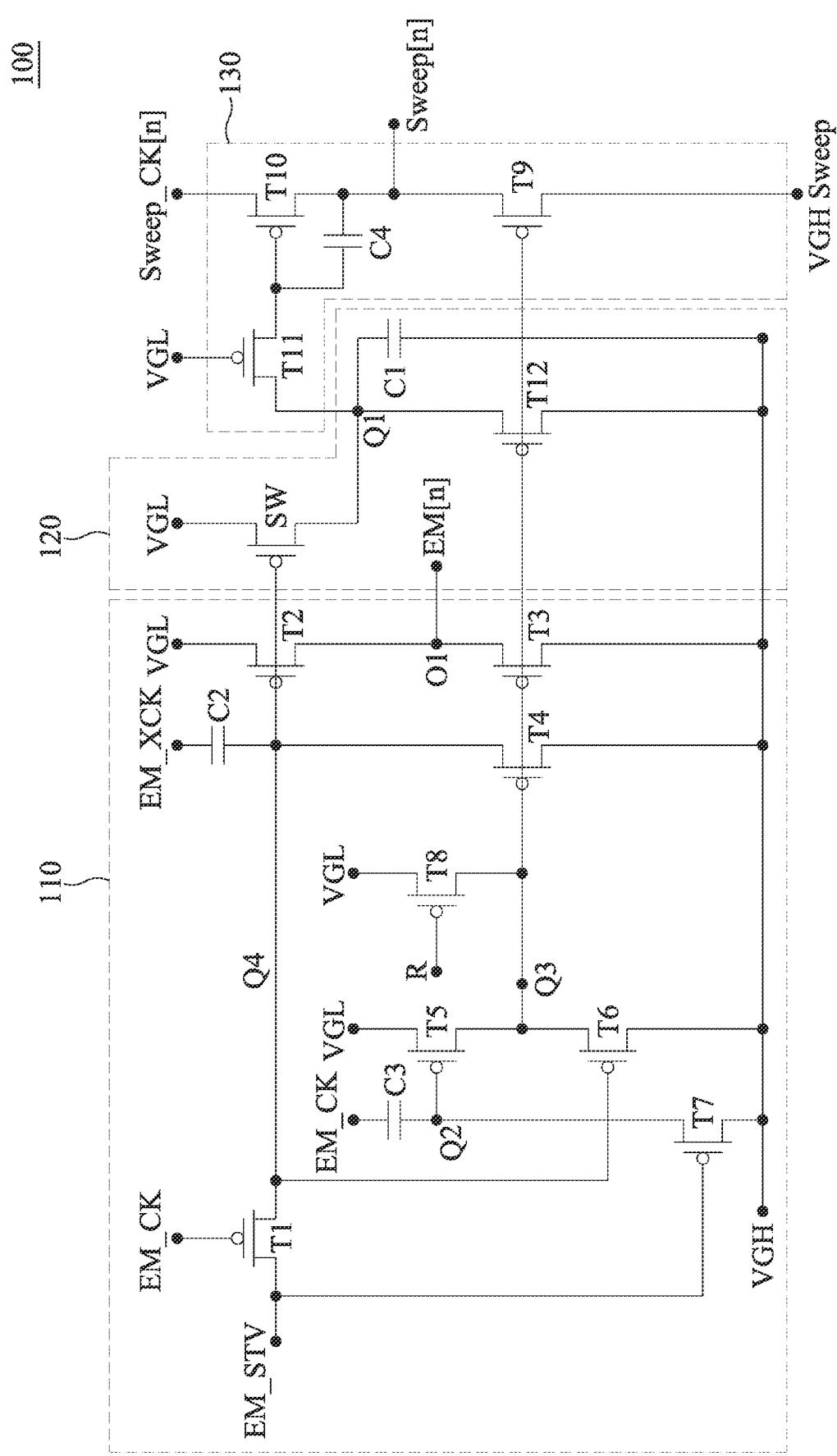
FIG. 3 depicts a schematic diagram of a shift register circuit according to some embodiments of the present disclosure.

FIG. 3 depicts a schematic diagram of a shift register circuit 100 according to some embodiments of the present disclosure. In some embodiments, the shift register circuit 100 shown in FIG. 3 is corresponding to the shift register circuit 100 shown in FIG. 1 or the shift register circuit 100 in FIG. 2.

In some embodiments, the driving signal generating circuit 110 includes transistors T1 to T8, a capacitor C2, and a capacitor C3. Please start form a top end and a right end of each of an element shown in the figure as a first end, each of transistors includes a first end, a second end, and a control end. Each of capacitors includes a first end and a second end. The second end of the transistor T1 is configured to receive a previous driving signal of a driving signal EM[n] (e.g. a previous driving signal EM[n−1]) or an initial signal EM_STV, and transmit the previous driving signal of the driving signal EM[n] or the initial signal EM_STV to a node Q4 according to the first clock signals EM_CK and EM_XCK.

In some embodiments, a transistor T5, a transistor T6, and a transistor T7 of the driving signal generating circuit 110 are pull-down operation circuits. The first end of the transistor T5 is configured to receive a low voltage source VGL. The second end of the transistor T5 is coupled to the first end of the transistor T6 and a node Q3. The control end of the transistor T5 is configured to output the low voltage source VGL to a node Q3 according to a signal situation of a node Q2. The second end of the transistor T6 is configured to a first high voltage source VGH.

In some embodiments, please refer to FIG. 3, the first end of the transistor T7 is coupled to the control end of the transistor T5 and a node Q2. The node Q2 is configured to receive one of first clock signals (the first clock signal EM_CK or the first clock signal EM_XCK) through the capacitor Q3. The second end of the transistor T7 is configured to receive the first high voltage source VGH.

In some embodiments, the first end of the transistor T8 is configured to receive the low voltage source VGL. The control end of the transistor T8 is configured to output the low voltage source VGL to the second end of the transistor T8 and the node Q3 according to a reset signal R.

In some embodiments, the first end of the transistor T4 is coupled to the second end of the capacitor C2 and the node Q4. The first end of the transistor T4 is configured to receive one of the first clock signals (the first clock signal EM_CK or the first clock signal EM_XCK) through the capacitor C2. The control end of the transistor T4 is coupled to the node Q3. The second end of the transistor T4 is configured to receive the first high voltage source VGH.

In some embodiments, the first end of the transistor T2 is configured to receive the low voltage source VGL. The control end of the transistor T2 is coupled to node Q4. In some embodiments, the first end of the transistor T3 is coupled to an output end O1 and the second end of the transistor T2. The second end of the transistor T3 is configured to receive the first high voltage source VGH.

It should be noted that the coupling circuit 120 is a bridge connecting the driving signal generating circuit 110 and the sweep signal generating circuit 130. The circuit connection of the coupling circuit 120 of the present disclosure will be described in detail in the subsequent specification.

In some embodiments, the sweep signal generating circuit 130 includes transistors T9 to T11 and a capacitor C4. Each of transistors includes a first end, a second end, and a control end. Each of capacitors includes a first end and a second end. The second end of the transistor T11 is coupled to a node Q1 of the coupling circuit 120. The control end of the transistor T11 is configured to receive the low voltage source VGL. The first end of the transistor T11 is coupled to the control end of the transistor T10. The first end of the transistor T10 is configured to receive a second clock signal Sweep_CK[n]. The second end of the transistor T10 is coupled to the first end of the transistor T9. The control end of the transistor T9 is coupled to the node Q3 of the driving signal generating circuit 110. The second end of the transistor T9 is configured to receive a second high voltage source VGH Sweep.

Please refer to FIG. 1 to FIG. 3, it should be noted that a plurality of data lines DL are locate between the driving signal generating circuit 110 and the sweep signal generating circuit 130, and the first high voltage source VGH received by the driving signal generating circuit 110 and the second high voltage source VGH Sweep received by the sweep signal generating circuit 130 can be designed to be electrically independent of each other. In other word, the first high voltage source VGH and the second high voltage source VGH Sweep are from different signal source respectively.

Figure 4:
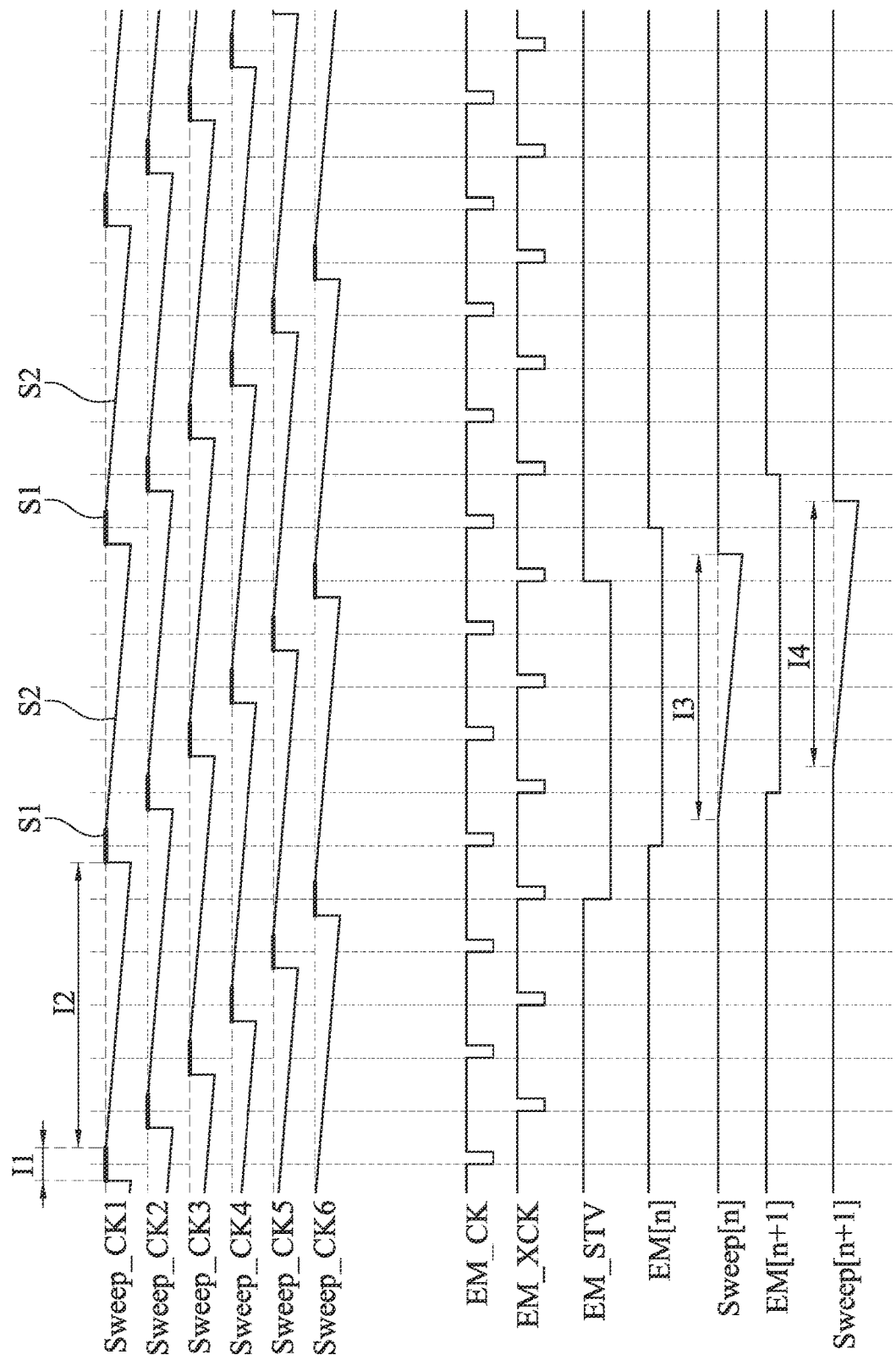
FIG. 4 depicts a timing diagram of driving signals of a shift register circuit according to some embodiments of the present disclosure.

In some embodiments, in order to facilitate the understanding of the shift register circuit 100 of FIG. 3, please refer to FIG. 4 together, FIG. 4 depicts a timing diagram of driving signals of a shift register circuit 100 according to some embodiments of the present disclosure. The driving signal generating circuit 110 is configured to receive a plurality o first clock signals (e.g. first clock signal EM_CK and first clock signal EM_XCK), a low voltage source VGL, an initial signal EM_STV, and a first high voltage VGH so as to output a driving signal EM[n] according to the plurality of first clock signals, the low voltage source VGL, the initial signal EM_STV, and the first high voltage VGH. It is noted that n in the driving signal EM[n] is a positive integer. The aforementioned driving signal EM[n] is a driving signal for luminescence in a display panel.

In addition, the coupling circuit 120 is configured to transmit a driving signal having the low voltage source VGL to the sweep signal generating circuit 130.

Moreover, the sweep signal generating circuit 130 is configured to receive a second clock signal Sweep_CK[n], the low voltage source VGL, and a second high voltage source VGH Sweep. The sweep signal generating circuit 130 is configured to output a sweep signal Sweep[n] according to the second clock signal Sweep_CK[n], the low voltage source VGL, and the second high voltage source VGH sweep. It is noted that n in the second clock signal Sweep_CK[n] and the sweep signal Sweep[n] shown in FIG. 3 is a positive integer. It is noted that a waveform of the sweep signal Sweep[n] includes an oblique waveform. The first high voltage source VGH and the second high voltage source VGH Sweep are electrically independent of each other.

Furthermore, please refer to FIG. 4, the second clock signals Sweep_CK1 to Sweep_CK6 are arranged from a top of FIG. 4 to a bottom of FIG. 4 according to the time sequence of the second clock signal Sweep_CK1 to the second clock signal Sweep_CK6. As shown in FIG. 3 to FIG. 4, when the sweep signal generating circuit 130 is configured to receive a second clock signal Sweep_CK1, the sweep signal generating circuit 130 is configured to output a sweep signal Sweep[n]. Then, when the sweep signal generating circuit 130 is configured to receive a second clock signal Sweep_CK2, the sweep signal generating circuit 130 is configured to output a sweep signal Sweep[n+1]. A phase shift is between the sweep signal Sweep[n] and the sweep signal Sweep[n+1]. Since sweep signal generating steps, which are used to generate a sweep signal according a second clock signal Sweep_CK3, a second clock signal Sweep_CK4, a second clock signal Sweep_CK5, and the second clock signal Sweep_CK6 by the sweep signal generating circuit 130, are similar to sweep signal generating steps, which are used to generate a sweep signal according to the second clock signal by the sweep signal generating circuit 130, repetitious details are therefore omitted herein.

When the aforementioned sweep signal generating circuit 130 is configured to receive the second clock signal Sweep_CK1 to the second clock signal Sweep_CK6, the low voltage source VGL and the second high voltage source VGH Sweep received by the sweep signal generating circuit 130 are all the same. In some embodiments, the sweep signal generating circuit 130 determines sweep signal outputs according to the different second clock signals.

In some embodiments, waveforms of the first clock signals EM_CK and EM_XCK are different from waveforms of the second clock signals Sweep_CK[n]. In some embodiments, the waveforms of each of the first clock signals EM_CK and EM_XCK includes square waves. In some embodiments, the waveforms of each of the second clock signal Sweep_CK[n] includes a first signal S1 and a second signal S2. For example, please refer to FIG. 4, the second clock signal Sweep_CK1 includes the first signal S1 and the second signal S2. Each of the first signals S1 includes a horizontal waveform. Each of the second signals S2 includes an oblique waveform.

In some embodiments, each of the second clock signals Sweep_CK2 to Sweep_CK6 includes the first signal S1 and the second signal S2. In some embodiments, a period I3 of the sweep signal Sweep[n] from the sweep signal generating circuit 130 is about six times units of scan time of pixels of a display. A period I4 of the sweep signal Sweep[n+1] from the sweep signal generating circuit 130 is about six times units of scan time, and is approximately equal to a period T2 of the second signal S2. When the sweep signal generating circuit 130 uses the second clock signal Sweep_CK3, the second clock signal Sweep_CK4, the second clock signal Sweep_CK5, and the second clock signal Sweep_CK6, sweep signals generated from the sweep signal generating circuit 130 are about six times units of scan time. In some embodiments, a period I1 of the first signal S1 of the second clock signal Sweep_CK[n] received by sweep signal generating circuit 130 ranges from 0.5 unit of scan time to one unit of scan time, a period I2 of the second signal S2 is approximately the same as the sweep signal Sweep[n]. In some embodiments, the unit of scan time is a time that whole column of pixels are swept. In some embodiments, the unit of scan time is about 16.7 (μs).

In some embodiments, please refer to FIG. 3 and FIG. 4, each of the aforementioned first clock signals EM_CK and EM_XCK, the aforementioned initial signal EM_STV, and the aforementioned second clock signal Sweep_CK[n] is a high frequency signal. Each of the low voltage source VGL, the aforementioned second high voltage source VGH Sweep, and the aforementioned first high voltage source VGH is a low frequency signal. It is noted that the first high voltage source VGH and the second high voltage source VGH Sweep are a direct current (DC) high voltage source with independent electrical properties respectively. In other words, the first high voltage source VGH and the second high voltage source VGH Sweep can be the same voltage level. However, the first high voltage source VGH and the second high voltage source VGH Sweep are controlled by two different and electrically independent voltage sources respectively. In this way, the different voltage sources can prevent the sweep signal generating circuit 130 and the driving signal generating circuit from interfering in the voltage level with each other during an operation. In some embodiments, the second high voltage source VGH Sweep and the first high voltage source VGH can be a high voltage source, for example, a value of a high voltage source is 15V. The low voltage source VGL can be a low voltage source, for example, a value of a low voltage source is −5V. In other embodiments, the second high voltage source VGH Sweep and the first high voltage source VGH can be a high voltage source, but not limited to the same voltage level.

In some embodiments, please refer to FIG. 3, the coupling circuit 120 includes a capacitor C1. Please start form a top end and a right end of each of an element shown in the figure as a first end, the capacitor C1 includes a first end and a second end. The first end of the capacitor C1 is coupled to the sweep signal generating circuit 130 through a first node. The second end of capacitor C1 is coupled to the driving signal generating circuit 110. The capacitor C1 is configured to stabilize the sweep signal Sweep[n]. The second end of the capacitor C1 is configured to receive the first high voltage source VGH.

In some embodiments, the coupling circuit 120 includes a first transistor SW. The first transistor SW includes a first end, a second end, and a control end. The first end of the first transistor SW is configured to receive the low voltage source VGL. The first transistor SW is turned on in response to the control end receiving the initial signal EM_STV. The second end of the first transistor SW is configured to transmit the low voltage source VGL to the first node Q1. It is noted that the first transistor SW is configured to isolate a high frequency signal (e.g. the initial signal EM_STV) and is configured to transmit a low frequency signal (e.g. low voltage source VGL) to the sweep signal generating circuit 130.

In some embodiments, the coupling circuit 120 includes a transistor T12. The transistor T12 includes a first end, a second end, and a control end. The first end of the transistor T12 is coupled to the node Q1. The second end of the transistor T12 is configured to receive the first high voltage source VGH. The control end of the transistor T12 is coupled to the node Q3 of the driving signal generating circuit 110.

In addition, please refer to FIG. 1 to FIG. 4, the aforementioned first transistor SW isolates high frequency signal and serves as a switching function. Therefore, the driving signal generating circuit 110 and the sweep signal generating circuit 130 can be designed at two sides of data lines DL according to actual needs.

In some embodiments, the driving signal generating circuit 110 includes a second transistor T2. The second transistor T2 includes a first end, a second end, and a control end. The first end of the second transistor T2 is configured to receive the low voltage source VGL. The second transistor T2 is turned on in response to the control end receiving the initial signal EM_STV. The second end of the second transistor T2 is configured to receive the driving signal EM[n].

Figure 5:
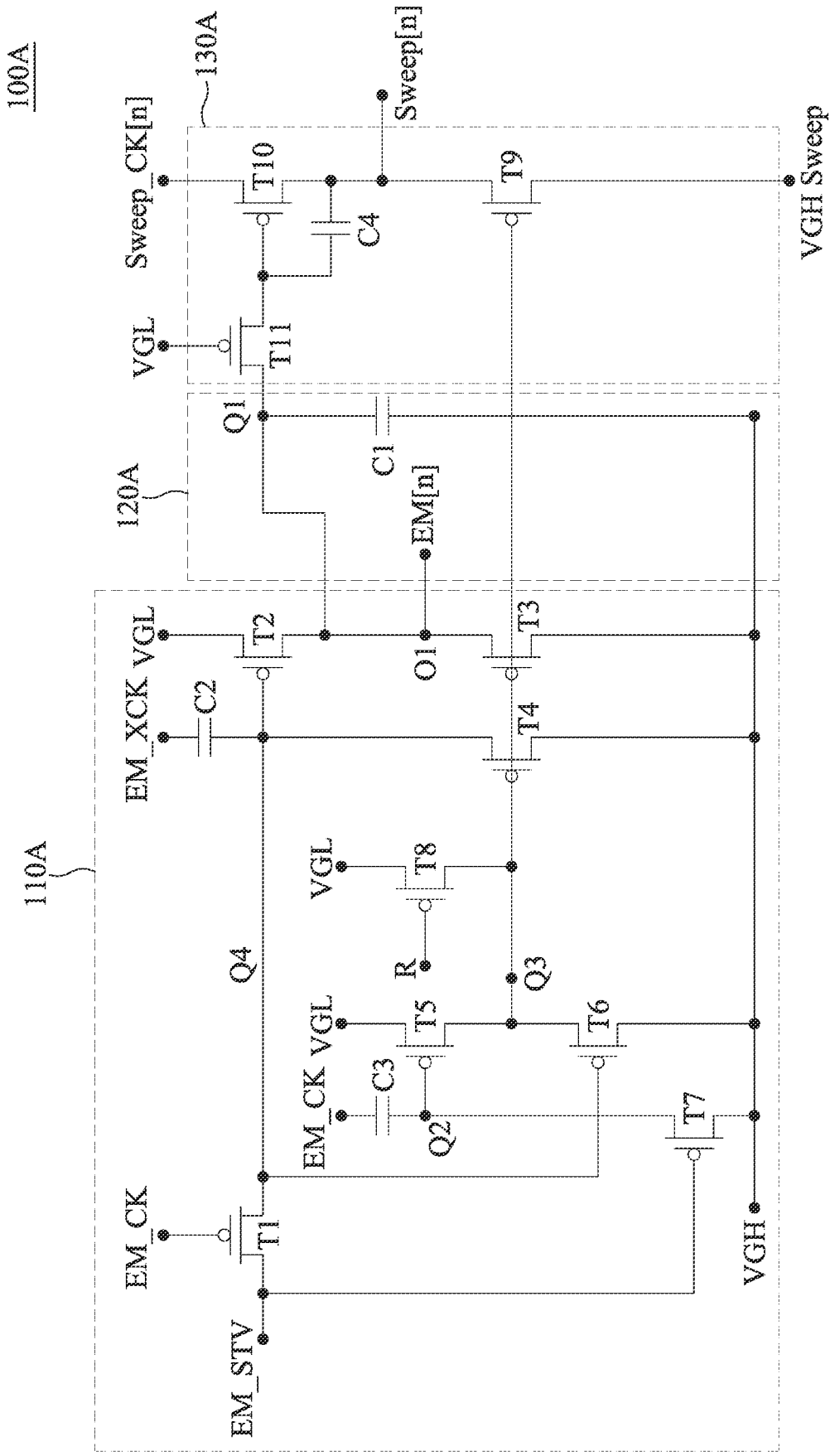
FIG. 5 depicts a schematic diagram of a shift register circuit according to some embodiments of the present disclosure.

FIG. 5 depicts a schematic diagram of a shift register circuit 100A according to some embodiments of the present disclosure. In some embodiments, as shown in FIG. 5, compared with the shift register circuit 100 shown in FIG. 3, the coupling circuit 120A of the shift register circuit 100A only includes the capacitor C1. Since the rest structure and function of the coupling circuit 120A are the same as the coupling circuit 120 of the shift register circuit 100, repetitious details are omitted herein. The first end of the capacitor C1 is coupled to the second end of the second transistor T2 of the driving signal generating circuit 110A. The second transistor T2 is turned on and outputs the driving signal EM[n] to an output end O1 according to the initial signal EM_STV. In some embodiments, the shift register circuit 100A mainly outputs the sweep signal sweep signal Sweep [n]. The output end O1 of the driving signal generating circuit 110A can be designed to output the driving signal EM[n] or not to output the driving signal EM[n] according to actual needs. In some embodiments, the shift register circuit 100A is suitable for a circuit layout with a small load or a circuit layout for high-resolution images which have must have at least 300 pixels per inch. Pixels per inch (PPI) is an indicator of image resolution.

Figure 6:
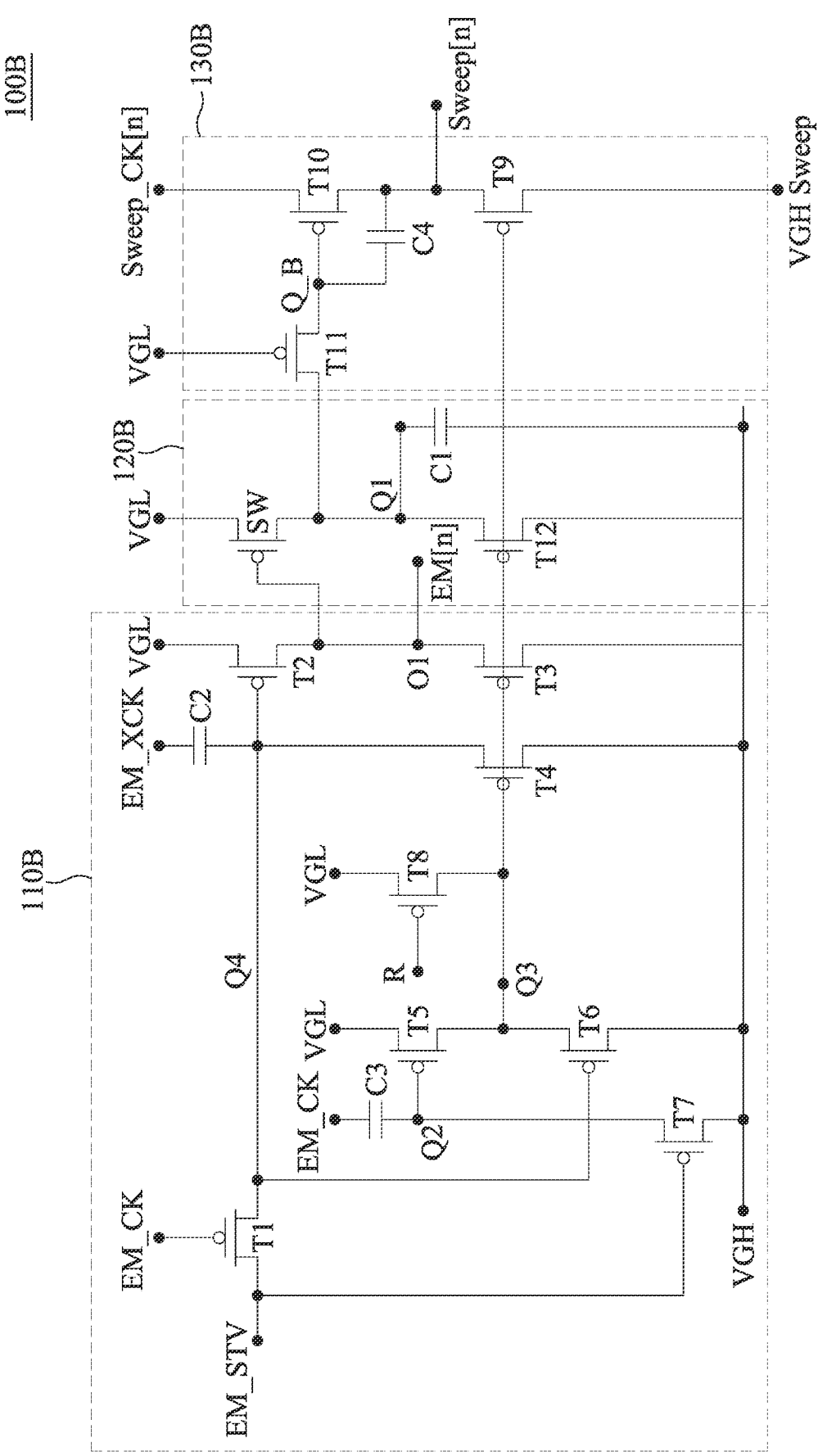
FIG. 6 depicts a schematic diagram of a shift register circuit according to some embodiments of the present disclosure.

FIG. 6 depicts a schematic diagram of a shift register circuit 100B according to some embodiments of the present disclosure. In some embodiments, compared with shift register circuit 100 shown in FIG. 3, only the connection of the first transistor SW is changed in a coupling circuit 120B of the shift register circuit 100B. The rest structure and function of the coupling circuit 120B of shift register circuit 100B are the same as the coupling circuit 120 of the shift register circuit 100, and repetitious details are omitted herein.

In some embodiments, please refer to FIG. 1 to FIG. 6, the first end of the first transistor SW is coupled to the second end of the second transistor T2 of the driving signal generating circuit 100B, in other words, the first transistor SW is coupled to the output end O1 which output the driving signal EM[n]. Therefore, the first transistor SW is dependent on a driving signal generating circuit 110B or a sweep signal generating circuit 130B. The first transistor SW can be designed in the driving signal generating circuit 110B or the sweep signal generating circuit 130B or other locations of the pixel driving device 1000 according to PPI. In other words, the first transistor SW can be disposed in the location of the coupling circuit 120 shown in FIG. 1 or the location of the coupling circuit 120 shown in FIG. 2 or other locations except the driving signal generating circuit 110, the coupling circuit 120, and the sweep signal generating circuit 130 in the pixel driving device 1000.

Based on the above embodiments, the present disclosure provides a shift register circuit and a pixel driving device so as to improve mura effect in a panel and output a high quality of a sweep signal.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A shift register circuit, comprising:
   a driving signal generating circuit, configured to receive a plurality of first clock signals, a low voltage source, an initial signal, and a first high voltage source so as to output a driving signal according to the plurality of first clock signals, the low voltage source, the initial signal, and the first high voltage source;
   a coupling circuit, coupled to the driving signal generating circuit, and configured to transmit the low voltage source; and
   a sweep signal generating circuit, coupled to the coupling circuit, and configured to receive a second clock signal, the low voltage source, and a second high voltage source so as to output a sweep signal according to the second clock signal, the low voltage source, and the second high voltage source, wherein a waveform of the sweep signal comprises an oblique waveform, wherein the first high voltage source and the second high voltage source are electrically independent of each other.

2. The shift register circuit of claim 1, wherein the coupling circuit comprises a capacitor, wherein the capacitor comprises a first end and a second end, wherein the first end of the capacitor is coupled to a first node, wherein the second end of the capacitor is coupled to the sweep signal generating circuit, wherein the capacitor is configured to stabilize the sweep signal.

3. The shift register circuit of claim 2, wherein the coupling circuit comprises a first transistor, wherein the first transistor comprises a first end, a second end, and a control end, wherein the first end of the first transistor is configured to receive the low voltage source, wherein the first transistor is turned on in response to the control end receiving the initial signal, wherein the second end of the first transistor is configured to transmit the low voltage source to the first node.

4. The shift register circuit of claim 3, wherein the driving signal generating circuit comprises a second transistor, wherein the second transistor comprises a first end, a second end, and a control end, wherein the first end of the second transistor is configured to receive the low voltage source, wherein the second transistor is turned on in response to the control end receiving to the initial signal, wherein the second end of the second transistor is configured to output the driving signal, wherein the first end of the first transistor is coupled to the second end of the second transistor.

5. The shift register circuit of claim 1, wherein waveforms of the first clock signals are different from waveforms of the second clock signal, wherein the second clock signal comprises a first signal and a second signal, wherein the first signal comprises a horizontal waveform, wherein the second signal comprises an oblique waveform.

6. The shift register circuit of claim 5, wherein a period of the sweep signal is about six times units of scan time of pixels of a display, wherein a period of the first signal ranges from 0.5 unit of scan time to one unit of scan time.

7. A pixel driving device, comprising:
at least one data line, wherein the at least one data line comprises a first side and a second side, wherein the first side is opposite to the second side; and
at least one shift register circuit, comprising:
a driving signal generating circuit, configured to receive a plurality of first clock signals, a low voltage source, an initial signal, and a first high voltage source so as to output a driving signal according to the plurality of first clock signals, the low voltage source, the initial signal, and the first high voltage source;
a coupling circuit, coupled to the driving signal generating circuit, and configured to transmit the low voltage source; and
a sweep signal generating circuit, coupled to the coupling circuit, and configured to receive a second clock signal, the low voltage source, and a second high voltage source so as to output a sweep signal according to the second clock signal, the low voltage source, and the second high voltage source, wherein a waveform of the sweep signal comprises an oblique waveform, wherein the first high voltage source and the second high voltage source are electrically independent of each other;
wherein the driving signal generating circuit is located at the first side of the at least one data line, wherein the sweep signal generating circuit is located at the second side of the at least one data line.

8. The pixel driving device of claim 7, wherein the coupling circuit comprises a capacitor, wherein the capacitor comprises a first end and a second end, wherein the first end of the capacitor is coupled to a first node, wherein the second end of the capacitor is coupled to the sweep signal generating circuit, wherein the capacitor is configured to stabilize the sweep signal.

9. The pixel driving device of claim 8, wherein the coupling circuit comprises a first transistor, wherein the first transistor comprises a first end, a second end, and a control end, wherein the first end of the first transistor is configured to receive the low voltage source, wherein the first transistor is turned on in response to the control end receiving the initial signal, wherein the second end of the first transistor is configured to transmit the low voltage source to the first node.

10. The pixel driving device of claim 9, wherein the driving signal generating circuit comprises a second transistor, wherein the second transistor comprises a first end, a second end, and a control end, wherein the first end of the second transistor is configured to receive the low voltage source, wherein the second transistor is turned on in response to the control end receiving the initial signal, wherein the second end of the second transistor is configured to output the driving signal, wherein the first end of the first transistor is coupled to the second end of the second transistor.

* * * * *